United States Patent [19]

Ring

[11] 3,768,031

[45] Oct. 23, 1973

[54] BRIDGE AMPLIFIER SUITABLE FOR MANUFACTURE IN MONOLITHIC INTEGRATED CIRCUIT FORM

[75] Inventor: Charles Martin Ring, Tempe, Ariz.

[73] Assignee: Motorola, Inc., Franklin Park, Ill.

[22] Filed: June 9, 1972

[21] Appl. No.: 261,314

[52] U.S. Cl. .................................. 330/15, 330/146

[51] Int. Cl. ............................................ H03f 3/26

[58] Field of Search ................. 330/22, 40, 15, 146; 307/254, 262

[56] References Cited

UNITED STATES PATENTS

| | | | |
|---|---|---|---|
| 3,558,915 | 1/1971 | Wood et al. | 307/262 X |
| 3,330,970 | 7/1967 | Wennerberg et al. | 330/146 X |
| 3,191,121 | 6/1965 | Nelson | 307/254 X |

*Primary Examiner*—Roy Lake
*Assistant Examiner*—James B. Mullins
*Attorney*—Foorman L. Mueller et al.

[57] ABSTRACT

The bridge amplifier includes NPN transistors for performing all critical amplifying functions, diodes for providing quiescent bias and resistors which have noncritical values. Hence, the bridge amplifier is suitable for manufacture in monolithic form. In response to portions of the input signal of one polarity, a switch circuit of the bridge amplifier applies a given power supply potential to a first terminal of the electrical load and an analog stage connected to the second terminal of the load controls the magnitude of the current flowing through the load to another power supply potential. In response to portions of the input signal of the other polarity, a further switch circuit applies the given power supply potential to the second terminal of the load and a further analog stage controls the magnitude of the load current. Thus, the load current flows in opposite directions through the load under the control of portions of the input signal having different polarities.

14 Claims, 3 Drawing Figures

BRIDGE AMPLIFIER SUITABLE FOR MANUFACTURE IN MONOLITHIC INTEGRATED CIRCUIT FORM

BACKGROUND OF THE INVENTION

Bridge amplifier circuits comprised of discrete components are known to have important advantages over other amplifier configurations for some applications, such as in automotive systems operating from supply voltages of a limited value. Attempts have been made to provide a bridge amplifier circuit in the form of a monolithic integrated circuit so that reduced size and increased reliability along with other advantages inherent in integrated circuits can be realized. However, prior art bridge amplifier configurations designed for discrete applications are not suitable for direct integration into monolithic forms.

More specifically, the electrical load of a prior art bridge circuit is usually direct coupled between the center points of two push-pull stages which include at least four transistors and associated passive components. To provide efficient operation so as to not exceed the maximum power dissipation capabilities or to not create an excessive drain on the power supply, it is necessary that the amplitude of the offset voltage applied across the load by the bridge amplifier at quiescent or no input signal conditions be kept to a minimum. Thus, it is essential that each of the outputs of the bridge amplifier circuit develop voltages having nearly equal amplitudes when the input signal is not applied so that virtually no offset voltages results across the electrical load. To accomplish this, the quiescent bias voltages on all four transistors of the prior art bridge amplifier must be carefully adjusted to balance out the differences in transistor and component characteristics.

In some prior art circuits, potentiometers are used to adjust the bias voltages and hence balance the voltage applied by the bridge amplifier to each terminal of the electrical load. In other applications, where efficiency at quiescent operating conditions is not so critical, a voltage divider comprised of resistors having precise values may be employed. These prior art circuit configurations which require potentiometers or resistors of critical values are undesirable because of the difficulty of providing such components in monolithic form by inexpensive processes. Furthermore, resistors having the values and tolerances required by prior art discrete bridge circuits take up too much space and thereby increase the size and reduce the yield of resulting integrated circuits. On the other hand, if external discrete balancing potentiometers are employed with monolithic circuits, the expense and size of the product is increased.

Moreover, some discrete bridge amplifier configurations are inefficient when amplifying an input signal. This is because there are generally a plurality of active devices located between each end terminal of the electrical load and the power supply terminals. Assuming that these active devices are transistors, the base-to-emitter voltages thereof form voltage drops in series with the output voltage. Thus, a plurality of such transistors may limit the maximum peak-to-peak amplitude of the output voltage developed across the load to an undesirable level. As a result, the efficiency of the prior art bridge amplifier circuit is decreased because the transistors convert electrical power into heat which is particularly unwanted in an integrated circuit having limited heat dissipating capabilities.

Furthermore, many discrete bridge circuits employ NPN driving transistors and PNP output transistors. Monolithic PNP power transistors formed in the same epitaxial layer as NPN transistors tend to have structures that provide excessive capacitance and too little current gain. These capacitances tend to cause unwanted phase shifts and parasitic loops which require compensating feedback networks to be connected with the amplifier to prevent oscillation. Such networks often utilize resistors or capacitors having values and tolerances that are not suitable to be provided in monolithic form. The use of external compensating components again undesirably increases the cost and size of the product having an integrated amplifier circuit including poor quality PNP transistors.

SUMMARY OF THE INVENTION

One object of this invention is to provide an improved bridge amplifier.

Another object is to provide an amplifier circuit having only a few resistors of noncritical values, which is suitable for manufacture in the form of a monolithic integrated circuit.

Still another object is to provide a bridge amplifier circuit having only two devices in which current flow need be carefully balanced during quiescent operating conditions and wherein this balancing can be performed without the use of resistors having critical values, or potentiometers.

A further object is to provide a monolithic bridge amplifier circuit having only NPN transistors in the analog portions thereof and a low input impedance which decreases the tendency of the circuit to oscillate.

A still further object is to provide a bridge amplifier circuit having higher quiescent and dynamic electrical efficiencies than prior art bridge amplifier circuits.

An additional object is to provide a bridge amplifier circuit suitable for manufacture in monolithic form on an integrated circuit chip having a relatively small size as compared to a chip including a prior art bridge amplifier circuit.

The bridge amplifier circuit, in response to an input signal which has first and second portions of different polarities, develops an output signal having an increased power level across an electrical load. The bridge amplifier includes a first switch circuit which has a control terminal connected to receive the input signal, a first terminal connected to receive a first direct current potential and a second terminal connected to a first terminal of the electrical load. A first analog circuit, which operates in cooperation with the first switch circuit includes an electron control device having a first electrode connected to the second terminal of the electrical load, a control electrode also connected to receive the input signal and a second electrode connected to receive a second direct current potential. The first switch circuit is rendered conductive only by the first portions of the input signal to apply the first direct current potential to the first terminal of the load. The electron control device causes the magnitude of the current flowing through the first switch circuit and the electrical load in a first direction to be proportional to the magnitudes of the first portions of the input signal.

Moreover, the bridge amplifier includes a second switch circuit and a second analog circuit which are rendered operative only by the second portions of the input signal of the other polarity. The second switch circuit has a control terminal connected to receive the input signal, a first terminal connected to receive the first direct current potential and a second terminal connected to the second terminal of the electrical load. The second analog circuit includes another electron control device which has a first electrode connected to the first terminal of the electrical load, a control electrode connected to receive the input signal and a second electrode connected to receive the second direct current potential. In response to the second portions of the input signals, the second switch circuit is rendered conductive to apply the first direct current potential to the second terminal of the load, and the second electron control device causes the magnitude of the current flowing through the second switch circuit and the electrical load in the second direction to be proportional to the magnitude of the second portions of the input signal.

DETAILED DESCRIPTION

A bridge amplifier can deliver the same power output into a given electrical load with half the supply voltage and with transistors having half the voltage breakdown capabilities as a more conventional amplifier circuit. This improved performance is achieved because the bridge circuit swings the amplitude of the output voltage developed across the electrical load over the full supply voltage on each half cycle. Thus, the bridge amplifier circuit is particularly attractive for applications in which the magnitude of the supply voltage is limited such as in automobiles or aircraft. Moreover, the bridge amplifier circuit does not require expensive and bulky load coupling capacitors or transformers.

Figure 1:
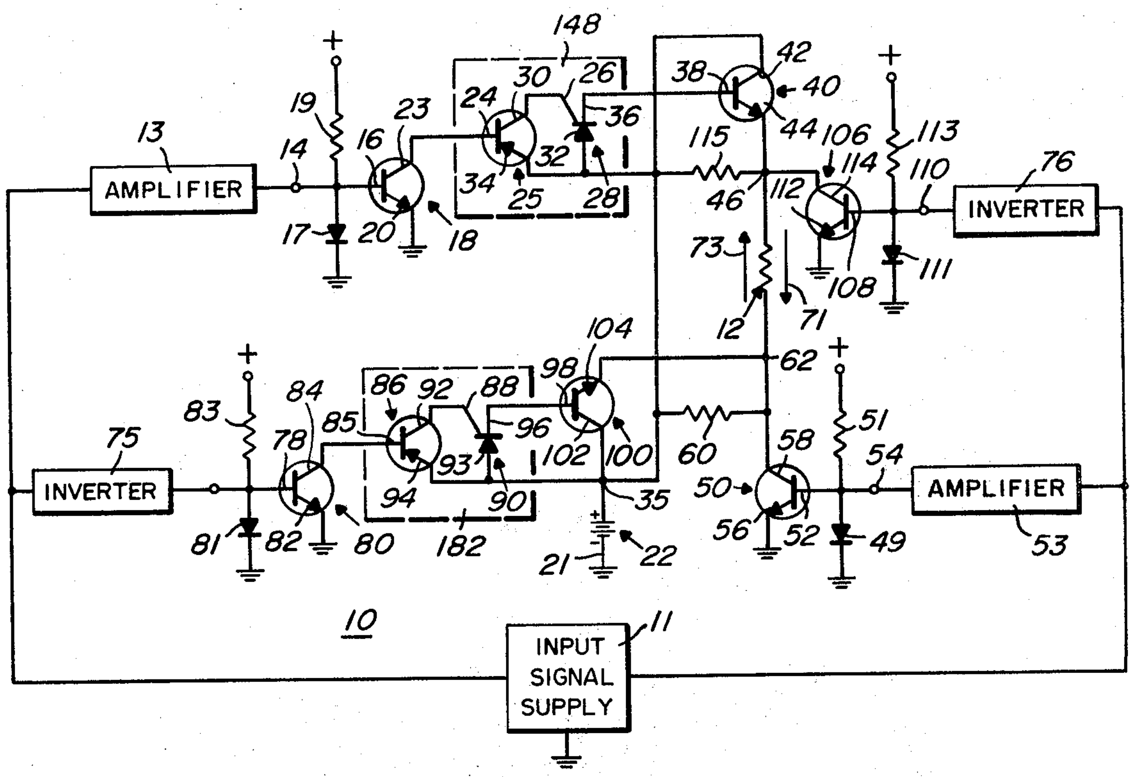
FIG. 1 is a schematic diagram of a bridge amplifier in accordance with the invention which is suitable for being provided either in discrete form or adapted to monolithic form.

Referring to FIG. 1, bridge amplifier circuit 10 of one embodiment of the invention is shown which does not have many of the characteristics associated with prior art bridge circuits which make them unsuitable for being provided in monolithic form. Generally, circuit 10 amplifies a sinusoidal input signal provided by supply 11 to provide a sinusoidal output signal across load resistance 12, which may be a speaker. Circuit 10 may be considered to be comprised of two amplifier portions. The first amplifier portions includes a first switch circuit which operates in cooperation with a first analog circuit in response to portions of the input signal of one polarity to provide output voltage portions of one polarity across the load. The other amplifier portion includes a second switch circuit which operates in cooperation with a second analog circuit in response to portions of the input signal of the other polarity to provide output voltage portions of the other polarity across the load.

The output of signal supply 11 is connected through amplifier 13 to input terminal 14 of the first switch circuit. Input terminal 14 is connected to base or control electrode 16 of NPN driver transistor 18 which is biased near conduction by the voltage developed across diode 17 in response to current provided through resistor 19. Emitter 20 of driver transistor 18 is connected to receive a negative or reference potential provided at terminal 21 of power supply 22, which is shown in the form of a battery. Collector 23 of transistor 18 is connected to base 24 of PNP inverter transistor 25. Gate terminal 26 of silicon controlled rectifier (SCR) 28 is connected to collector 30 of transistor 25 and anode 32 of the SCR is connected to emitter 34 of transistor 25. Both anode 32 and emitter 34 are connected to positive terminal 35 of power supply 22. Cathode 36 of SCR 28 is connected to base 38 of NPN switch transistor 40. Collector 42 of transistor 40 is connected to positive power supply terminal 35 and emitter 44 is connected to terminal 46 of electrical load 12. The first switch circuit includes driver transistor 18, inverter transistor 25, SCR 28 and switching transistor 40.

The first analog circuit, which operates in cooperation with the first switch circuit to form one amplifier portion, includes control transistor 50 which is biased near conduction by the voltage across diode 49 in response to current provided through resistor 51. The output of signal supply 11 is connected through output terminal 54 of amplifier 53 to base electrode 52 of transistor 50. Emitter electrode 56 is connected to negative power supply terminal 21. Collector 58 of transistor 50 is connected through bias resistor 60 to povitive power supply terminal 35 and to the other terminal 62 of load resistor 12.

Figure 2:
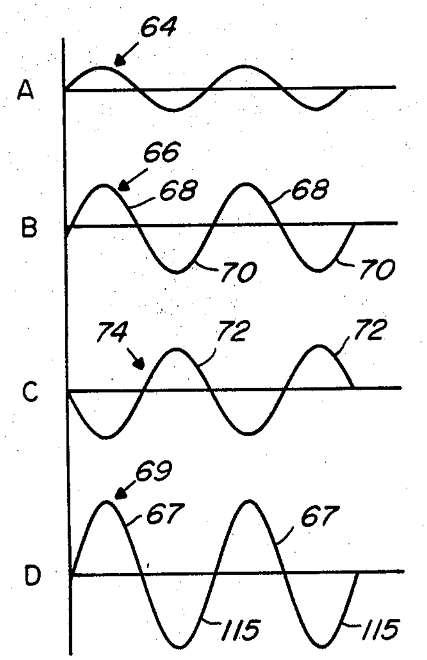
FIG. 2 is a graph of input, differential and output waveforms used to explain the operation of the bridge amplifier.

The above described amplifier portion is suitable for amplifying the positive portions of input signal 64 of part A of FIG. 2, which is provided by signal supply 11. An inphase differential signal 66, shown in part B of FIG. 2, is provided in response to input signal 64 at the output of amplifiers 13 and 53. It would also be possible to directly drive the first amplifier portion with the input signal assuming it has sufficient amplitude. Signal 66, which is comprised of positive portions 68 and negative portions 70, is applied between input terminals 14 and 54 with respect to reference terminal 21. During portions 68, as the magnitude of signal 66 increases in a positive direction, driver transistor 18 is rendered conductive. Consequently, a base current path is provided which renders inverted transistor 25 conductive. As a result, SCR 28 is turned on to connect the positive potential at terminal 35 through the SCR to base 38 of switch transistor 40 which is then also rendered conductive. Transistor 40 conducts the positive power supply potential to terminal 46 of load resistor 12. The foregoing switching action occurs during a small portion of the initial part of positive portion 68 of the signal 66.

Simultaneously, positive portion 68 of differential signal 66 renders control transistor 50 operative so that it allows current to flow through saturated switch transistor 40 and load 12. This load current has an amplitude that is proportional to the amplitude of the positive portion 68 of driving signal 66, and flows in the direction of arrow 71 to form positive going portions 67 of output signal 69 of part D of FIG. 2. As the positive portions of input signal 64 pass through zero all devices of the first switch circuit and control transistor 50 return to their nonconductive states.

Negative going portions of input signal 64 are amplified by the second amplifier portion which includes a second switch circuit and a second analog circuit. These two circuits respond only to positive going signals. Hence, they are driven by the positive portions 72 of out-of-phase differential signal 74 shown in part C of FIG. 2, which are derived by inverting the negative portions of input signal 64. Inverters 75 and 76, which have inputs connected to the output of signal supply 11, process input signal 64 to provide signal 74 which is 180° out-of-phase with input signal 64 and differential signal 66.

More particularly, the second switch circuit is driven by the inverted and amplified input signal 64 applied through inverter 75 which is connected to input or control electrode 78 of NPN driver transistor 80. Diode 81 and resistor 83 bias transistor 80 near conduction. Emitter 82 of transistor 80 is connected to receive a negative or reference potential provided at terminal 21 of power supply 22 and collector 84 is connected to base 85 of PNP inverter transistor 86. Gate terminal 88 of SCR 90 is connected to collector 92 of transistor 86 and anode 93 of the SCR is connected to emitter 94 of transistor 86. Both anode 93 and emitter 94 are connected to positive terminal 35 of power supply 22. Cathode 96 of SCR 90 is connected to base 98 of NPN switch transistor 100. Collector 102 of transistor 100 is connected to positive terminal 35 and emitter 104 is connected to terminal 62 of load 12. Hence, the second switch circuit includes driver transistor 80, inverter transistor 86, SCR 90 and switch transistor 100.

The second analog circuit, which operates in cooperation with the second switch circuit to form the second amplifier portion includes control transistor 106. The base electrode 108 of transistor 106 is connected to input terminal 110 and emitter electrode 112 is connected to negative terminal 21. Diode 111 and resistor 113 bias transistor 106 near conduction to prevent crossover distortion. Collector 114 of transistor 106 is connected to terminal 46 of load resistor 12 and through bias resistor 115 to positive terminal 35.

In operation, out-of-phase differential input signal 74 is applied to the second switch and control circuits by respective inverters 75 and 76. The initial positive parts of portions 72 of signal 74, which corresponds to and are derived from the negative portions of the input signal 64, render driver transistor 80, inverter transistor 86 and SCR 90 conductive so that switch transistor 100 saturates to apply the positive power supply voltage to terminal 62 of load resistor 12. Control transistor 106 is also rendered operative by positive portions 72 to allow current flow through switch transistor 100 and load 12. This load current has a magnitude which is proportional to the magnitude of out-of-phase driving signal 74. As a result, current flows through resistor 12 in the direction of arrow 73 to form negative going portions 115 of output signal 69. As the negative portions of input signal 64 pass through zero, all devices of the second switch circuit and the second control transistor 106 return to their nonconductive states.

Thus, the first switch and analog circuits form a first amplifier portion which responds to the positive portions of the input signal to provide corresponding positive portions of an output signal of increased power level. Similarly, the second switch and analog circuits form a second amplifier portion which responds to the negative portions of the input signal to provide corresponding negative portions of the output of increased power level.

Figure 3:
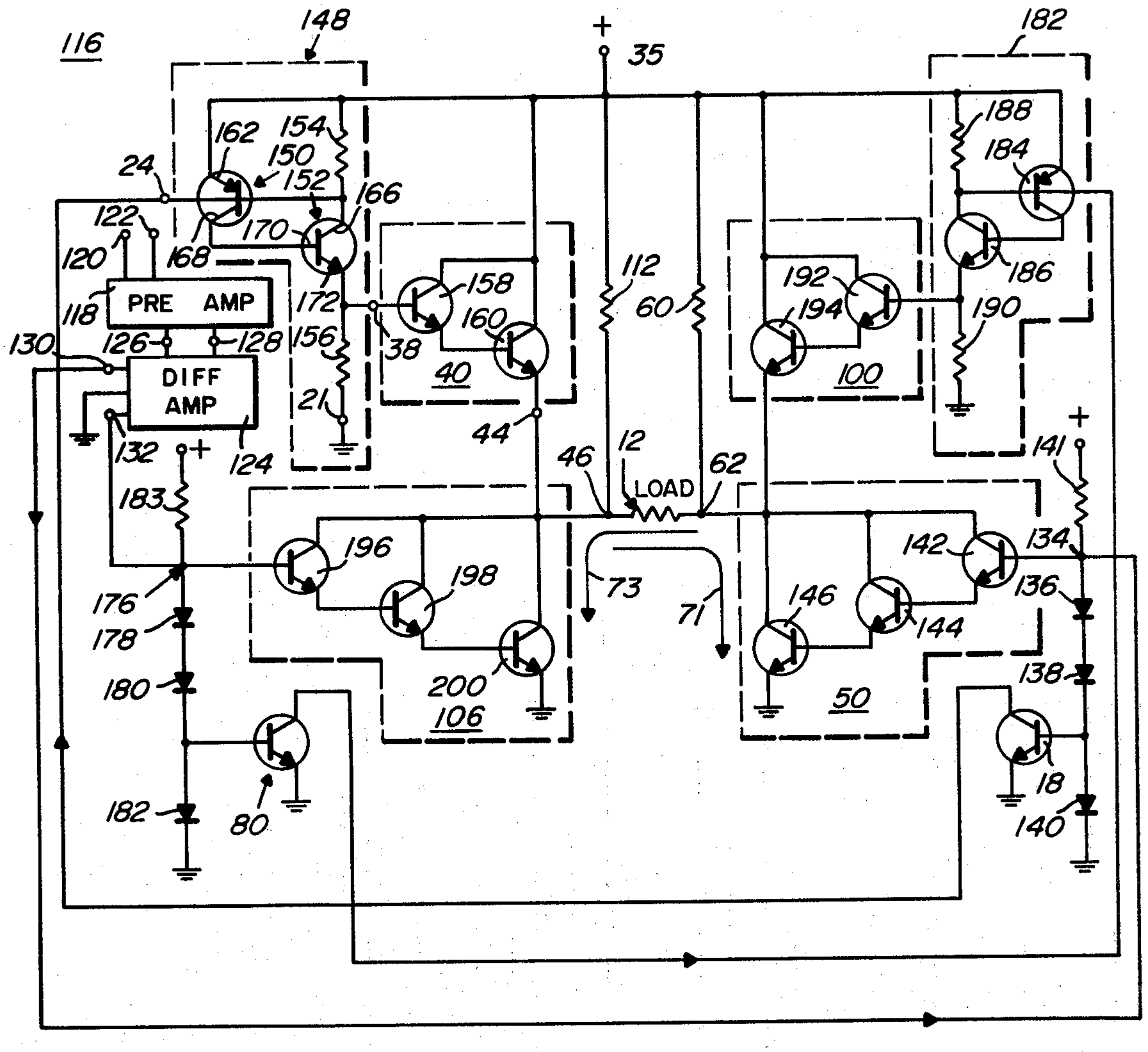
FIG. 3 is a partial block and schematic diagram of one adaptation of the bridge amplifier of FIG. 1 into monolithic form.

FIG. 3 shows one adaptation of circuit 10 in FIG. 1 which is suitable for manufacture in monolithic form. Reference numbers are used in FIG. 3 which correspond to reference numbers already used in FIG. 1 to show the correlation between the corresponding parts of the two amplifiers. Alternative circuitry is shown in FIG. 3 for developing differential driving signals 66 and 74 from input signal 64. More particularly, in circuit 116 pre-amplifier 118 is shown, which may be of a known configuration, and which has input terminals 120 and 122 for receiving input signal 64. Pre-amplifier 118 may have input impedance, gain, output impedance and other characteristics designed for a particular application. Differential amplifier 124, which also may be of known configuration, has input terminals 126 and 128 which are connected to the output terminals of pre-amplifier 118. Differantial amplifier 124 amplifies input signal 64 to provide first differential signal 66 at output terminal 130, and inverts and amplifies input signal 64 to provide second differential signal 74 at output terminal 132. Either or both of amplifiers 118 and 124 may be provided on the same chip as the bridge amplifier of FIG. 3.

Terminals 14 and 54 of FIG. 1 have been merged to form input terminal 134 for the first amplifier portion of FIG. 3. Series connected diodes 136, 138 and 140 respond to current supplied through resistor 141 to form a quiescent biasing voltage for the first switch and analog circuits. More specifically, the voltage developed across all three diodes tends to bias first control transistor 50, which includes three Darlington connected transistors 142, 144 and 146, near conduction. The voltage developed by diode 140 biases driver transistor 18 of the first switch near conduction. Inverter transistor 25 and SCR 28 of FIG. 1 are combined together in the circuitry shown in block 148 of FIG. 3 which includes PNP transistor 150, NPN transistor 152, resistor 154 and resistor 156. First switch transistor 40 is provided by Darlington connected transistors 158 and 160.

Referring now more specifically to the combination inverter and SCR included in block 148 of FIG. 3, emitter 162 of transistor 150 is connected to positive supply terminal 35 and base 24 along with collector 166 are connected to positive terminal 35 by resistor 154. Collector 168 of transistor 150 is connected to base 170 of transistor 152. Emitter 172 of transistor 152 is connected through resistor 156 to the negative reference potential and to base 38 of composite switch transistor 40.

In operation, the circuitry of block 148 is nonconductive except during positive portions 68 of differential signal 66. These portions are inverted by driver transistor 18 and applied to base electrode 24. As a result, current is conducted from positive power supply terminal 35 through transistor 150 to provide base current for transistor 152. Consequently, transistor 152 is rendered conductive to allow a significantly greater amount of current to flow through resistors 154 and 156. Part of the current flowing through resistor 154 also supplies base current for transistor 150. Thus, by regenerative action, transistor 150 "latches" or continues to supply enough base current to transistor 152 to keep it saturated during the positive portions of input signal 64. Resistor 156 allows circuit 148 to rapidly turn on by shunting the relatively high input impedance of the Darlington pair included in switch device 40. The voltage across resistor 156 causes switch transistor 40 to saturate so that the positive power supply voltage applied to terminal 35 is connected to terminal 46 of load 12. Control transistor 50 of the first analog circuit allows current flow in direction 71 through load 12 which has a magnitude that is proportional to the amplitude of the positive portions of input signal 64.

Similarly, terminals 78 and 110 of FIG. 1 have been merged to form one input terminal 176 for the second amplifier portions of FIG. 3. Series connected diodes 178, 180 and 182 form the quiescent biasing potentials for the switch and analog circuits of the second amplifier in response to current provided through resistor 183. Inverter transistor 86 and SCR 90 of FIG. 1 are combined together in the circuitry shown in block 182 of FIG. 3 which includes PNP transistor 184, NPN transistor 186, resistor 188 and resistor 190. Switch transistor 100 is provided by Darlington connected transistors 192 and 194. Control transistor 106 of the second analog portion of the second amplifier is formed by Darlington connected transistors 196, 198 and 200.

In operation, the circuitry of block 182 is rendered conductive in the same manner as the circuitry included in block 148, but in response to the positive going portions 72 of differential driving signal 74. Switch device 100 saturates during the positive portions of out-of-phase differential signal 74 to apply the positive supply potential to terminal 62 of load 12. Furthermore, control device 106 responds to the positive portions of differential signal 74 to control the current flowing through load 12 in the direction of arrow 73. As a result, negative going output voltage portions 115 are developed across load resistor 12.

Circuit 116, which can be readily provided in monolithic form, and circuit 10 have advantages over prior art circuits. More specifically, only the quiescent balancing of control devices 50 and 106 is critical. This biasing is accomplished by diode strings rather than resistors. Consequently, circuit 10 requires only six resistors and circuit 116 requires only eight resistors. These resistors may be of relatively noncritical values as compared to the values required by prior art bridge circuits thereby materially decreasing the size and increasing the yield of the integrated circuit chip. Moreover, NPN transistors are utilized at all critical points in circuits 10 and 116. The NPN transistors decrease instability problems and increase the gain of the circuit as compared to circuits employing PNP transistors to perform the same functions. The PNP devices of circuits 10 and 116 are used to perform noncritical inverting functions. The diode strings provide low input impedances to also increase stability and drive problems inherent in prior art circuits.

Furthermore, on each half cycle of operation only one transistor of a switch circuit and one transistor of an analog circuit is connected between each terminal of the load and each terminal of the power supply. The transistor of the switch circuit is saturated for most of the half cycle so that it provides little voltage drop. As a result, the peak output voltage developed across load 12 has a maximum value which is very nearly equal to the power supply potential. Hence, less power is wasted during dynamic operation than in many prior art circuits which have a plurality base-to-emitter voltage drop between the power supply terminals and each terminal of the load.

I claim:

1. A bridge amplifier circuit for developing an output signal across an electrical load having first and second terminals, which output signal has a magnitude that varies in linear manner in response to the varying magnitude of an input signal having portions of first and second polarities, the bridge amplifier circuit including in combination:

first switch means having a first terminal adapted to receive a direct current potential, a control terminal adapted to receive the input signal, and a second terminal connected to the first terminal of the electrical load, said first switch means being rendered conductive in response to the portions of the input signal of the first polarity to apply said direct current potential to the first terminal of the electrical load;

first amplifier means having a first electrode connected to the second terminal of the electrical load and a control electrode adapted to receive the input signal, said first amplifier means being responsive to the variable magnitude of the portions of the input signal of the first polarity to vary the magnitude of a first current flowing through the electrical load in a first direction in a linear manner with the variable magnitude of the portions of the input signal of the first polarity;

second switch means having a first terminal adapted to receive said direct current potential, a control terminal adapted to receive the input signal and a second terminal connected to the second terminal of the electrical load, said second switch means being rendered conductive in response to the portions of the input signal of the second polarity to thereby apply said direct current potential to the second terminal of the electrical load; and second amplifier means having a first electrode connected to the first terminal of the electrical load and a control electrode adapted to receive the input signal, said second amplifier means being responsive to the variable magnitude of the portions of the input signal of the second polarity to vary the magnitude of a second current flowing through the electrical load in a second direction in a linear manner with the variable magnitude of the portions of the input signal of the second polarity.

2. The bridge amplifier circuit of claim 1 wherein one of said first and said second switch means includes a silicon controlled rectifier means having an anode, a cathode and a gate.

3. The bridge amplifier circuit of claim 2 wherein said one of said first and said second switch means further includes:

driver means including a control terminal connected to receive said input signal, a first terminal connected to receive a direct current potential and a second terminal;

inverter means having a control terminal connected to said second terminal of said driver means, a first terminal connected to one of said anode and cathode of said silicon controlled rectifier means, and a second terminal connected to said gate of said silicon controlled rectifier means; and switchable electron control means having a first terminal connected to receive a direct current potential, a control terminal connected to the other said anode and cathode of said silicon controlled rectifier means, and a second terminal connected to the electrical load.

4. The bridge amplifier circuit of claim 3 wherein said driver means, said inverter means and said switchable electron control means respectively include a first transistor, a second transistor and a third transistor.

5. The bridge amplifier circuit of claim 1 wherein said first amplifier means includes a transistor having a collector forming said first electrode, a base forming said control electrode.

6. The bridge amplifier circuit of claim 1 wherein said second amplifier means includes a transistor having a collector forming said first electrode, a base forming said control electrode.

7. The bridge amplifier circuit of claim 1 wherein:

said first switch means and said first amplifier means include driving amplifier means; and said second switch means and said second amplifier means include driving inverter means.

8. The bridge amplifier circuit of claim 7 wherein said driving amplifier means and said driving inverter means are both provided by a differential amplifier means.

9. A monolithic bridge amplifier for developing an output signal which has a magnitude that varies in a linear manner with a variable magnitude of an input signal, the output signal having an increased power level with respect to the input signal and the output signal being developed across an electrical load with first and second terminals in response to first and second differential input signals each having portions of first and second polarities, the monolithic bridge amplifier including in combination:

first conductive means for providing a first direct current potential of a first polarity;

second conductive means for providing a second direct current potential of a second polarity;

first switch means having a first terminal connected to said first conductive means, a control terminal adapted to receive the first differential input signal, and a second terminal connected to the first terminal of the electrical load, said first switch means being rendered conductive in response to the portions of the first differential signal of the first polarity to thereby apply said first direct current potential to the first terminal of the electrical load;

first amplifier means having a first electrode connected to the second terminal of the electrical load, a control electrode adapted to receive the first differential input signal, and a second electrode connected to said second conductive means, said first amplifier means being responsive to the time variable magnitude of said portions of the first differential input signal of the first polarity to control the magnitude of a first current flowing through said first switch means and the electrical load in a first direction so that said magnitude varies in a linear manner with the variable magnitude of the portions of the first differential input signal of the first polarity;

second switch means having a first terminal connected to said first conductive means, a control terminal adapted to receive the second differential input signal, and a second terminal connected to the second terminal of the electrical load, said second switch means being rendered conductive in response to the portions of the second differential signal of the first polarity to apply said first direct current potential to the second terminal of the electrical load; and second amplifier means having a first electrode connected to the first terminal of the electrical load, a control electrode adapted to receive the second differential input signal, and a second electrode connected to said second conductive means, said second amplifier means being responsive to the variable magnitude of said portions of the second differential input signal of the first polarity to control the magnitude of a second current flowing through said second switch means and the electrical load in a second direction so that said magnitude of said second current varies in a linear manner with the variable magnitude of the portions of the second differential signal of the second polarity.

10. The monolithic bridge amplifier of claim 9 wherein said first switch means and said second switch means each include:

first transistor means having a first electrode connected to one of said conductive means and second and control electrodes, second transistor means having a control electrode connected to said second electrode of said first transistor means and a second electrode connected to said control electrode of said first transistor means and a first electrode, first resistive means connecting said second electrode of said second transistor means and said control electrode of said first transistor means to said one of said conductive means;

first circuit means connecting said first electrode of said second transistor means to the other of said conductive means;

second circuit means connecting said control terminal of said switch means to said control electrode of said first transistor means; and third circuit means connecting said first electrode of said second transistor means to the electrical load.

11. The monolithic bridge amplifier of claim 10 wherein said second circuit means includes a driver amplifier having its input terminal connected to said input terminal of said switch means and an output terminal connected to said control electrode of said first transistor means.

12. The monolithic bridge amplifier of claim 10 wherein said third circuit means includes a plurality of Darlington connected transistors.

13. The monolithic bridge amplifier of claim 9 wherein said first amplifier means and said second amplifier means each include:

Darlington transistor means having equivalent emitter, base and collector electrodes; and diode means connected between said equivalent base electrodes and one of said conductive means for providing quiescent bias potentials.

14. The monolithic bridge amplifier circuit of claim 13 wherein said diode means also provide quiescent bias voltages to said first switch means and to said second switch means.

* * * * *